(12) United States Patent
Kobayashi

(10) Patent No.: US 11,858,539 B2
(45) Date of Patent: Jan. 2, 2024

(54) TRANSPORT VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 846 days.

(21) Appl. No.: 16/960,977

(22) PCT Filed: Dec. 7, 2018

(86) PCT No.: PCT/JP2018/045132
§ 371 (c)(1),
(2) Date: Jul. 9, 2020

(87) PCT Pub. No.: WO2019/146276
PCT Pub. Date: Aug. 1, 2019

(65) Prior Publication Data
US 2020/0331503 A1    Oct. 22, 2020

(30) Foreign Application Priority Data
Jan. 24, 2018 (JP) .................. 2018-009964

(51) Int. Cl.
*B61B 3/02* (2006.01)
*B65G 1/04* (2006.01)
(Continued)

(52) U.S. Cl.
CPC .................. *B61B 3/02* (2013.01); *B65G 1/04* (2013.01); *H01L 21/677* (2013.01); *B65G 47/61* (2013.01)

(58) Field of Classification Search
CPC .. B61B 3/02; B65G 1/04; B65G 47/61; H01L 21/677
See application file for complete search history.

(56) References Cited

U.S. PATENT DOCUMENTS

2014/0047995 A1    2/2014 Kobayashi

FOREIGN PATENT DOCUMENTS

| JP | 2017-088332 A |   | 5/2017 |             |
|----|---------------|---|--------|-------------|
| JP | 2017088332 A  | * | 5/2017 | ... B66C 11/04 |

OTHER PUBLICATIONS

English translation of Official Communication issued in International Patent Application No. PCT/JP2018/045132, dated Aug. 6, 2020.

(Continued)

*Primary Examiner* — Robert J McCarry, Jr.
(74) *Attorney, Agent, or Firm* — Keating & Bennett, LLP

(57) ABSTRACT

A moving mechanism moves a swing suppression unit in a traveling direction between an advanced position contacting a FOUP and a retracted position away from the FOUP by a drive of a drive unit. A buffer mechanism that allows the swing suppression unit that has been moved to the advanced position by the drive of the drive unit to move to the traveling direction after stopping the drive of the drive unit. The buffer mechanism includes a first coupling portion and a rod-shaped portion coupled to the swing suppression unit to perform a movement of an operation amount in accordance with an amount of movement of the swing suppression unit to a second position direction, a first bias portion that biases the first coupling portion and the rod-shaped portion so that the swing suppression unit presses the FOUP, and a second bias portion that acts on the first coupling portion and the rod-shaped portion when the operation amount of the first coupling portion and the rod-shaped portion is greater than a predetermined amount and that biases the first coupling portion and the rod-shaped portion so that the swing suppression unit presses the FOUP.

11 Claims, 11 Drawing Sheets

(51) Int. Cl.
*H01L 21/677* (2006.01)
*B65G 47/61* (2006.01)

(56) References Cited

OTHER PUBLICATIONS

Official Communication issued in International Patent Application No. PCT/JP2018/045132, dated Feb. 26, 2019.

* cited by examiner

TRANSPORT VEHICLE

BACKGROUND OF THE INVENTION

1. Field of the Invention

One aspect of the present invention relates to a transport vehicle.

2. Description of the Related Art

An overhead transport vehicle that travels near the ceiling or a position higher than a floor surface of a cleanroom and the like and transports a container accommodating semiconductor wafers, reticles, liquid crystal substrates, or the like has been known. As such an overhead transport vehicle, for example, Japanese Unexamined Patent Publication No. 2012-166911 discloses an overhead transport vehicle that includes a swing suppression device that contacts a side surface (a front surface or a rear surface in a traveling direction of the overhead transport vehicle) of a container that is a transported object. With the overhead transport vehicle disclosed in Japanese Unexamined Patent Publication No. 2012-166911, the swing of the transported object that occurs during traveling can be suppressed.

SUMMARY OF THE INVENTION

A transport vehicle that transports a transported object, including such an overhead transport vehicle, is desired to transport a heavier transported object or transport the transported object at a faster speed. For this reason, a swing suppression device that suppresses a swing of a transported object is also desired to suppress a swing of the transported object more effectively.

Thus, preferred embodiments of the present invention provide transport vehicles each capable of effectively suppressing the swing of the transported object in the traveling direction.

A transport vehicle according to one aspect of a preferred embodiment of the present invention is a transport vehicle including a pair of swing suppression units configured to contact a transported object from front and rear in a traveling direction, a moving mechanism configured to move at least one of the swing suppression units in the traveling direction between a first position contacting the transported object and a second position spaced away from the transported object by a drive of a drive unit, and a buffer mechanism configured to allow the swing suppression unit that has been moved to the first position by the drive of the drive unit to move to the traveling direction after stopping the drive of the drive unit, wherein the buffer mechanism includes an operation portion coupled to the swing suppression unit and configured to perform a movement of an operation amount in accordance with an amount of movement of the swing suppression unit to the second position direction, a first bias portion configured to bias the operation portion so that the swing suppression unit presses the transported object, and a second bias portion configured to act on the operation portion when the operation amount of the operation portion is greater than a predetermined amount and to bias the operation portion so that the swing suppression unit presses the transported object.

In the transported vehicle of this configuration, when a swing occurs on the transported object after stopping the drive unit and when the swing suppression unit moves in the traveling direction, the first bias portion acts so that only the first bias portion biases the operation portion so as to press the transported object, if the swing of the transported object is within a predetermined range. Meanwhile, if the swing of the transported object exceeds the predetermined range, the second bias portion acts on the operation portion, and biases the operation portion so that the swing suppression unit presses the transported object. Accordingly, as soon as the swing of the transported object exceeds the predetermined range, the biasing force acting on the transported object is instantaneously switched. As a result, when the swing amount exceeds the predetermined range, one swing suppression unit that is pushed out by the transported object is biased with a relatively large biasing force, and the other swing suppression unit is biased with a relatively small biasing force. As a result, a situation in which the swing of the transported object continues due to both swing suppression units pushing with similar biasing forces is able to be suppressed or prevented. That is, as compared with the case of being supported with the same magnitude of biasing force from the traveling direction, the swing of the transported object in the traveling direction can be effectively reduced or prevented.

In a transport vehicle according to one aspect of a preferred embodiment of the present invention, the moving mechanism may include a supporting portion rotatable bidirectionally around a rotation shaft and configured to support the swing suppression unit, a drive shaft configured to rotate by a drive of the drive unit, a crank portion configured to rotate bidirectionally by rotation of the drive shaft, and a connecting portion coupled at one end to a position that is eccentric to the drive shaft of the crank portion so as to be rotatable bidirectionally and coupled at the other end to a position that is eccentric to the rotation shaft of the supporting portion so as to be rotatable bidirectionally. With this configuration, because the buffer mechanism is able to be provided in the connecting portion, the buffer mechanism is able to be compactly mounted.

In a transport vehicle according to one aspect of a preferred embodiment of the present invention, the drive shaft, a coupling position between the crank portion and the connecting portion, and a coupling portion between the connecting portion and the supporting portion may be located on one straight line in an extending direction of the connecting portion when the swing suppression unit is located at the first position. With this configuration, when the swing suppression unit is located at the first position, the crank portion and the connecting portion are located in a state of what is called a dead center, and an external force exerted on the swing suppression unit after stopping the drive unit is difficult to be transmitted to the drive unit. As a result, without using a drive unit with a large output, it is possible to resist the force transmitted to the swing suppression unit.

In a transport vehicle according to one aspect of a preferred embodiment of the present invention, the buffer mechanism may be provided in the connecting portion, the operation portion may include a first coupling portion coupled to the supporting portion and a rod-shaped portion coupled at one end to the first coupling portion, the buffer mechanism may further include a second coupling portion including a first body portion coupled to the crank portion and a second body portion that has an insertion hole through which the rod-shaped portion is inserted, and that is arranged at an interval from the first body portion, the first bias portion may be arranged so as to contact the first coupling portion and the second body portion, the second bias portion may be arranged in the first body portion or fixed to the other end of the rod-shaped portion, and the rod-shaped portion and the first body portion may come into contact with each other via the second bias portion when an operation amount of the operation portion exceeds a predetermined amount. With this configuration, the buffer mechanism can be easily provided in the connecting portion.

In a transport vehicle according to one aspect of a preferred embodiment of the present invention, the moving mechanism may include a first link portion fixed to the drive shaft, a second link portion rotatable bidirectionally around the rotation shaft, and a third link portion coupled to both of the first link portion and the second link portion so as to be rotatable bidirectionally, the third link portion may be movable between an advanced position arranged below the transported object and a retracted position arranged at a position retracted from below the transported object, movement of the third link portion to the advanced position may interlock with movement of the swing suppression unit to the first position, and movement of the third link portion to the retracted position may interlock with movement of the swing suppression unit to the second position. With this configuration, because the third link portion can be driven as a fall prevention portion that prevents the fall of the transported object by utilizing the power of the drive unit that is a drive source of the swing suppression unit, as compared with providing a drive unit for each, an overall size of the device is able to be made compact.

In a transport vehicle according to one aspect of a preferred embodiment of the present invention, the elastic modulus of the second bias portion may be greater than the elastic modulus of the first bias portion. With this configuration, the swing of the transported object in the traveling direction is able to be reduced or prevented.

In a transport vehicle according to one aspect of a preferred embodiment of the present invention, the second bias portion may have viscoelasticity. With this configuration, because the second bias portion has the viscoelasticity, the swing of the transported object is able to be attenuated.

In a transport vehicle according to one aspect of a preferred embodiment of the present invention, the first bias portion may be a spring and the second bias portion may be a rubber body. With this configuration, the first bias portion and the second bias portion capable of effectively reducing or preventing the swing of the transported object in the traveling direction is able to be easily configured.

According to one aspect of a preferred embodiment of the present invention, the swing of the transported object in the traveling direction is able to be effectively reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

With reference to the accompanying drawings, the following describes preferred embodiments of the present invention in detail. In the description of the drawings, identical elements and features will be denoted by identical reference signs and redundant explanations will be omitted.

Figure 1:
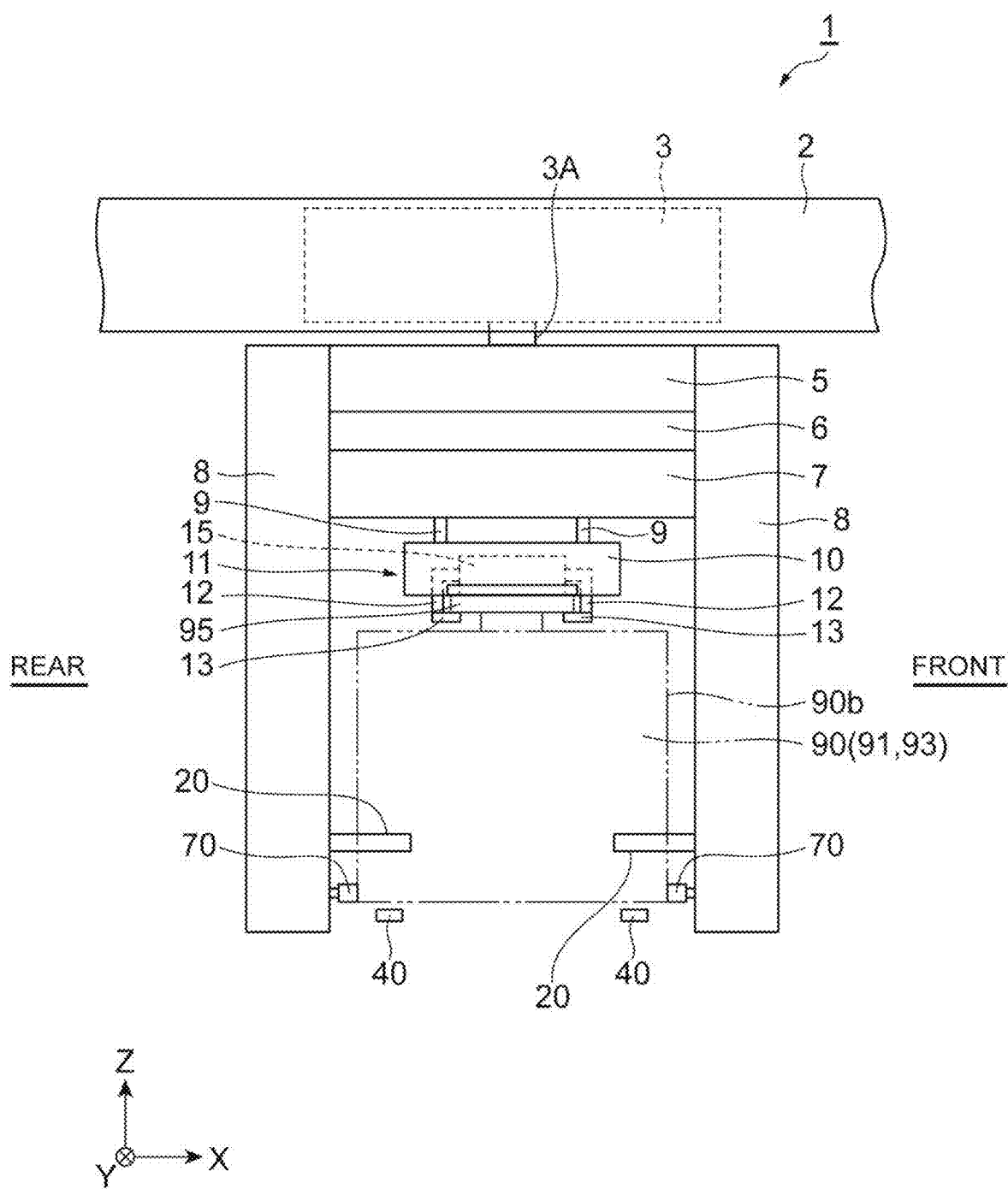
FIG. 1 is a front view illustrating an overhead transport vehicle according to a preferred embodiment of the present invention.

An overhead transport vehicle (transport vehicle) 1 illustrated in FIG. 1 travels along a traveling rail 2 provided at a position higher than the floor surface such as the ceiling and the like of a cleanroom. The overhead transport vehicle 1 transports a FOUP (front-opening unified pod) (transported object) 90 as an article, between a storage facility and a predetermined load port, for example. The FOUP 90 has a box-shaped housing 91 having an opening, and a lid 93 covering the opening. The lid 93 is detachably provided with respect to the housing 91. In the FOUP 90, a plurality of semiconductor wafers and the like are accommodated, for example. The FOUP 90 includes a flange 95 that is held by the overhead transport vehicle 1.

In the following description, for the sake of convenience of description, the left-and-right direction (X-axis direction) in FIG. 1 is defined as the front-and-rear direction (traveling direction) of the overhead transport vehicle 1. The up-and-down direction in FIG. 1 is defined as the vertical direction (Z-axis direction) of the overhead transport vehicle 1. The depth direction in FIG. 1 is defined as the width direction (Y-axis direction) of the overhead transport vehicle 1. The X-axis, Y-axis, and Z-axis are orthogonal to one another.

As illustrated in FIG. 1, the overhead transport vehicle 1 includes a traveling drive unit 3, a horizontal drive unit 5, a rotation drive unit 6, an elevating drive unit 7, an elevating device 10, a holding device 11, first fall prevention portions 20, second fall prevention portions (third link portions) 40, swing suppression units 70, rotation mechanisms 50 of the first fall prevention portions 20 (see FIG. 2 and FIG. 3), moving mechanisms of the second fall prevention portions 40 and the swing suppression units 70 (see FIG. 4 and FIG. 5), and buffer mechanisms 80. The overhead transport vehicle 1 is provided with a pair of frames 8 and 8 so as to cover the horizontal drive unit 5, the rotation drive unit 6, the elevating drive unit 7, the elevating device 10, and the holding device 11 from front and rear in the traveling direction. The pair of frames 8 and 8 define a space in which the FOUP 90 is accommodated below the holding device 11 in a state where the elevating device 10 is raised to an elevating end.

The traveling drive unit 3 moves the overhead transport vehicle 1 along the traveling rail 2. The traveling drive unit 3 is arranged in the traveling rail 2. The traveling drive unit 3 drives a roller (not depicted) that travels on the traveling rail 2. In the lower portion of the traveling drive unit 3, the horizontal drive unit 5 is coupled to via a shaft 3A. The horizontal drive unit 5 moves, in the horizontal plane, the rotation drive unit 6, the elevating drive unit 7, and the elevating device in the direction (width direction) that is orthogonal to an extending direction of the traveling rail 2. The rotation drive unit 6 rotates, in the horizontal plane, the elevating drive unit 7 and the elevating device 10. The elevating drive unit 7 raises and lowers the elevating device 10 by winding and unwinding four belts 9. The traveling drive unit 3 may be configured by a linear motor and the like that generates propulsion on the overhead transport vehicle 1. The belts 9 in the elevating drive unit 7 may use hanging members such as wires, ropes, and the like, as appropriate.

The elevating device 10 in the present preferred embodiment is capable of being raised and lowered by the elevating drive unit 7, and defines and functions as an elevating platform in the overhead transport vehicle 1. The holding device 11 holds the FOUP 90. The holding device 11 includes a pair of L-shaped arms 12 and 12, hands 13 and 13 fixed to each of the arms 12 and 12, and an opening and closing mechanism 15 that opens and closes the pair of arms 12 and 12.

The pair of arms 12 and 12 is coupled to the opening and closing mechanism 15. The opening and closing mechanism 15 moves the pair of arms 12 and 12 in a direction to approach each other and a direction to separate from each other. By the operation of the opening and closing mechanism 15, the pair of arms 12 and 12 advances and retracts along the X-axis direction. As a result, the pair of hands 13 and 13 fixed to the arms 12 and 12 opens and closes. In the present preferred embodiment, the height position of the holding device 11 (elevating device 10) is adjusted so that, when the pair of hands 13 and 13 is in an opened state, the holding surfaces of the hands 13 are lower than the height of the lower surface of the flange 95. Then, as the pair of hands 13 and 13 are in a closed state in this situation, the holding surfaces of the hands 13 and 13 advance below the lower surface of the flange 95, and by raising the elevating device 10 in this situation, the flange 95 is held by the pair of hands 13 and 13 and the FOUP 90 is supported.

Figure 2:
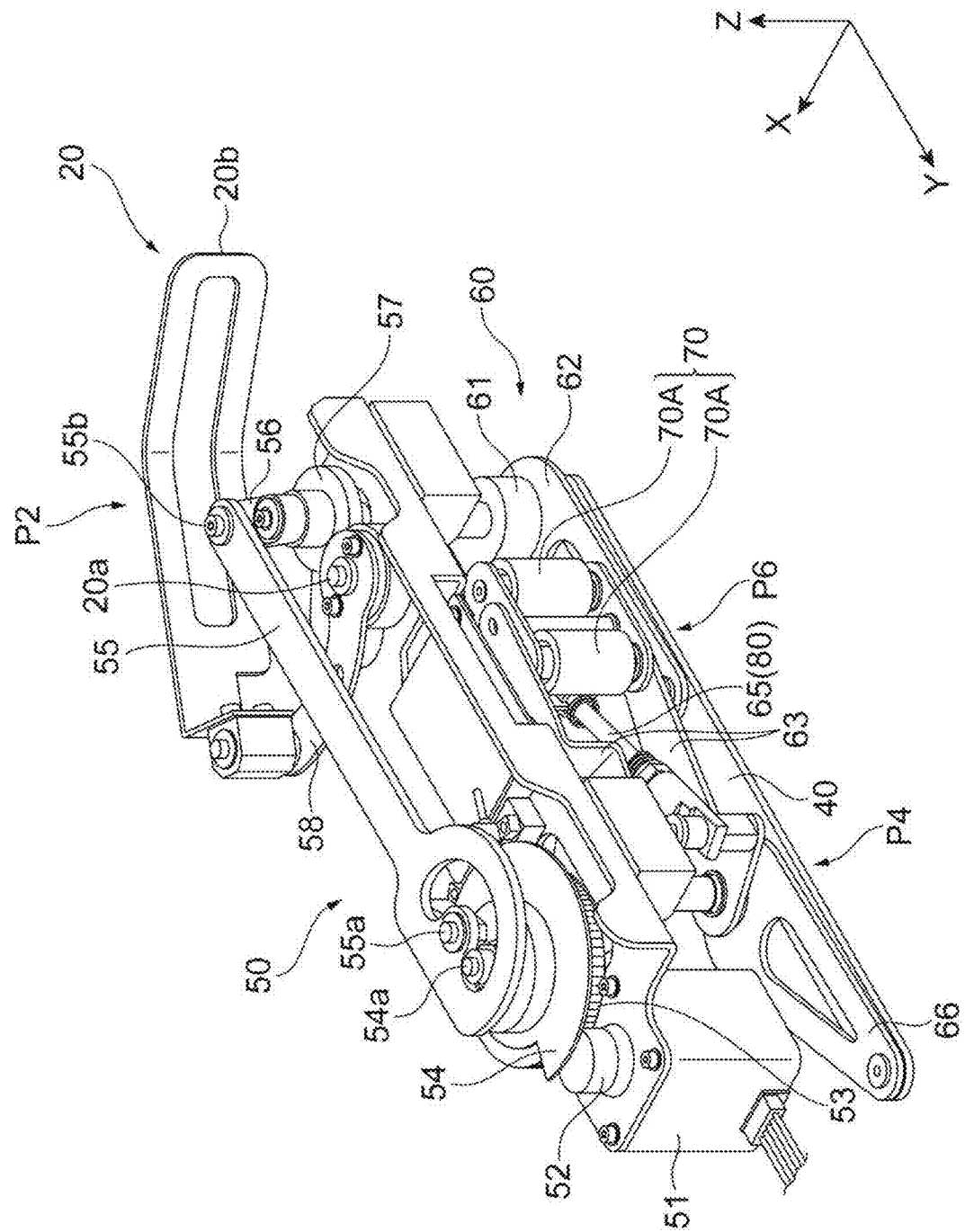
FIG. 2 is a perspective view illustrating a state of each mechanism when a first fall prevention portion, a second fall prevention portion, and a swing suppression unit of FIG. 1 are located in an advanced position.
Figure 3:
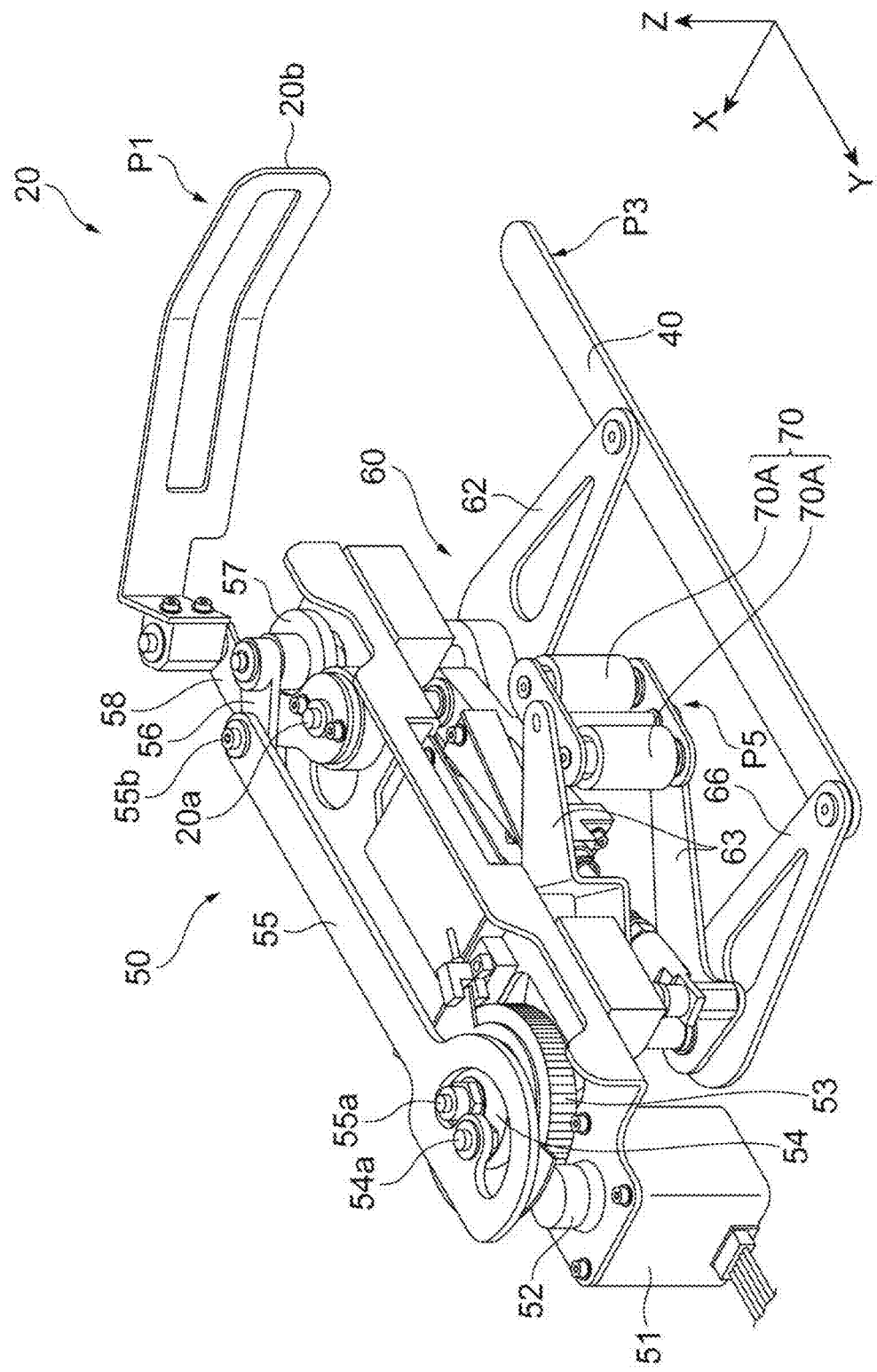
FIG. 3 is a perspective view illustrating a state of each mechanism when the first fall prevention portion, the second fall prevention portion, and the swing suppression unit of FIG. 1 are located in a retracted position.

As illustrated in FIG. 2 and FIG. 3, as the first fall prevention portion 20 is arranged in front of the lid 93, the lid 93 is prevented from falling from the FOUP 90 held by the holding device 11 (see FIG. 1). The first fall prevention portion 20 has a rotation axis in the Z-axis direction and is rotatable along a front surface 90a and a side surface 90b of the FOUP 90 between an advanced position P1 arranged in front of the lid 93 and a retracted position P2 arranged at a position retracted from the front of the lid 93. The first fall prevention portion 20 is a plate-shaped member extending to a distal end portion 20b with a rotation axis 20a as a base point. The first fall prevention portion 20 is made of a material such as stainless steel. A portion of the first fall prevention portion 20 is parallel to the lid 93 when the first fall prevention portion 20 is located in the advanced position P1.

The rotation mechanism 50 of the first fall prevention portion 20 is accommodated in each of the pair of frames 8 and 8. The rotation mechanism 50 includes a drive unit 51, a drive shaft 52, a first gear portion 53, a second gear portion 54, a link portion 55, a link portion 56, a third gear portion 57, and an arm portion 58. The rotation mechanism 50 converts the rotational motion of the drive unit 51 into a linear motion of the first fall prevention portion 20 (reciprocating motion between the advanced position and the retracted position).

The second fall prevention portion 40 is arranged on the lower surface of the FOUP 90, so that the FOUP 90 itself held by the holding device 11 (see FIG. 1) is prevented from falling and the lid 93 is prevented from falling from the FOUP 90. The second fall prevention portion 40 is a plate-shaped member extending in the Y-axis direction and is made of a material such as stainless steel. As illustrated in FIG. 2 to FIG. 5, the second fall prevention portion 40 is movable between an advanced position P3 arranged below the lid 93, and a retracted position P4 arranged in a position retracted from below the lid 93, that is, a position accommodated in the area of the frame 8 when viewed from above in the Z-axis direction.

The movement of the second fall prevention portion 40 to the advanced position P3 and the retracted position P4 interlocks with the movement of the first fall prevention portion 20 to the advanced position P1 and the retracted position P2. That is, if the first fall prevention portion 20 advances to the advanced position P1, the second fall prevention portion 40 also advances to the advanced position P3, and if the first fall prevention portion 20 retracts to the retracted position P2, the second fall prevention portion 40 also retracts to the retracted position P4.

Figure 4:
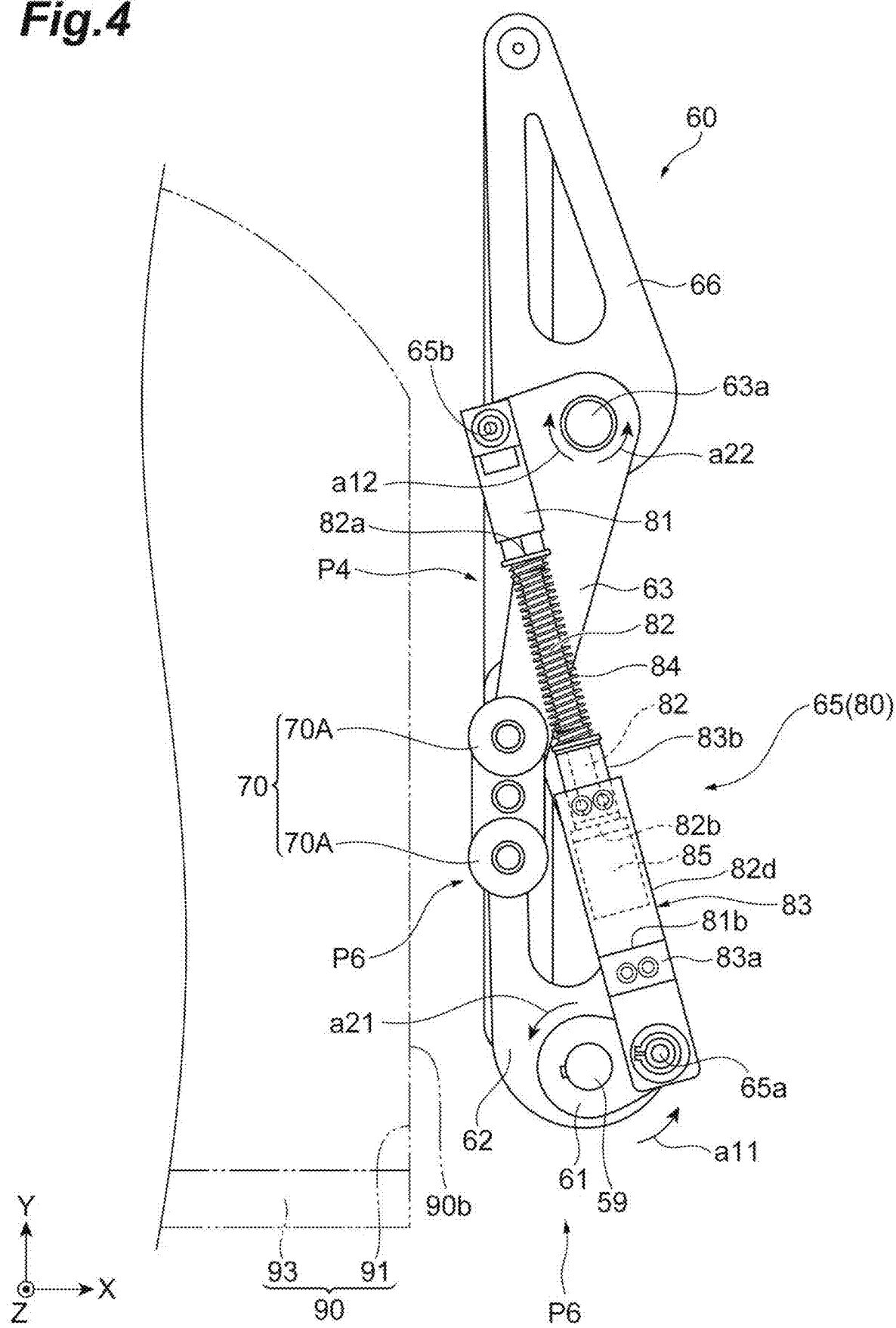
FIG. 4 is a perspective view illustrating a state of a moving mechanism and a buffer mechanism when the second fall prevention portion and the swing suppression unit of FIG. 1 are located in the advanced position.
Figure 5:
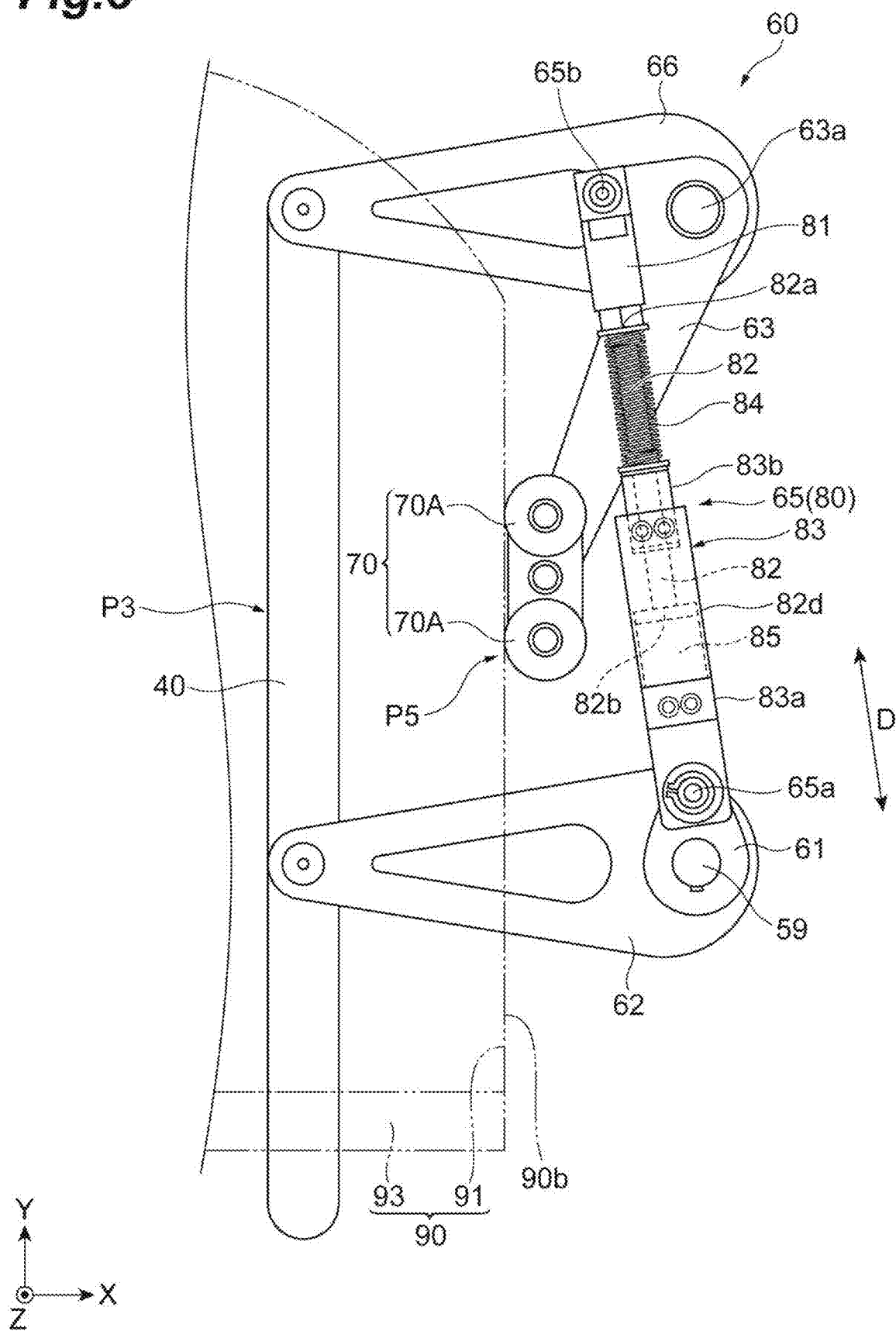
FIG. 5 is a perspective view illustrating a state of the moving mechanism and the buffer mechanism when the second fall prevention portion and the swing suppression unit of FIG. 1 are located in the retracted position.

The swing suppression unit 70 contacts and supports the side surface 90b of the FOUP 90, and suppresses the swing of the FOUP 90 held by the holding device 11 in the X-axis direction of the overhead transport vehicle 1 during traveling. As illustrated in FIG. 4 and FIG. 5, the swing suppression unit 70 includes two rollers 70A and 70A contacting and supporting the FOUP 90 (see FIG. 1). The swing suppression unit 70 is movable between an advanced position (first position) P5 contacting with the side surface 90b of the FOUP 90 and a retracted position (second position) P6 at a position away from the side surface 90b of the FOUP 90.

The movement of the swing suppression unit 70 to the advanced position P5 and the retracted position P6 interlocks with the movement of the first fall prevention portion 20 to the advanced position P1 and the retracted position P2. That is, if the first fall prevention portion 20 advances to the advanced position P1, the swing suppression unit 70 also advances to the advanced position P5, and if the first fall prevention portion 20 retracts to the retracted position P2, the swing suppression unit 70 also retracts to the retracted position P6. Furthermore, the movement of the swing suppression unit 70 to the advanced position P5 and the retracted position P6 interlocks with the movement of the second fall prevention portion 40 to the advanced position P3 and the retracted position P4. That is, if the second fall prevention portion 40 advances to the advanced position P3, the swing suppression unit 70 also advances to the advanced position P5, and if the second fall prevention portion 40 retracts to the retracted position P4, the swing suppression unit 70 also retracts to the retracted position P6. The following describes the second fall prevention portion 40, and the interlocking operation between the swing suppression unit 70 and the second fall prevention portion 40.

As illustrated in FIG. 2 to FIG. 5, the moving mechanism of the second fall prevention portion 40 and the swing suppression unit 70 is accommodated in each of the pair of frames 8 and 8 (see FIG. 1), and includes a rotation shaft (drive shaft) 59, a crank portion 61, a supporting portion 63, a connecting portion 65, a first link portion 62, and a second link portion 66.

The rotation shaft 59 integrally rotates with the third gear portion 57 that rotates in a series of advancing operations in the first fall prevention portion 20 (see FIG. 2 and FIG. 4). That is, the rotation shaft 59 rotates by the drive of the drive unit 51. The drive unit 51 includes a stepping motor, for example. The crank portion 61 is fixed to the rotation shaft 59 and rotates bidirectionally by the rotation of the rotation shaft 59. The supporting portion 63 is rotatable bidirectionally around a rotation shaft 63a and supports the swing suppression unit 70. The connecting portion 65 is coupled at one end to the crank portion 61 so as to be rotatable bidirectionally at a position (coupling portion 65a) that is eccentric to the rotation shaft 59 and is coupled at the other end to a position (coupling portion 65b) that is eccentric to the rotation shaft 63a of the supporting portion 63 so as to be rotatable bidirectionally. The first link portion 62 is fixed to the rotation shaft 59 and rotates bidirectionally by the rotation of the rotation shaft 59. The second link portion 66 is rotatable bidirectionally around the rotation shaft 63a as a center. The second link portion 66 rotates bidirectionally around the rotation shaft 63a as a center, by the movement of the connecting portion 65 that operates simultaneously with the rotation of the rotation shaft 59. The second fall prevention portion 40 is fixed to both of the first link portion 62 and the second link portion 66 so as to be rotatable bidirectionally.

As illustrated in FIG. 4 to FIG. 6A, in the connecting portion 65, a buffer mechanism 80 is provided. The buffer mechanism 80 allows the swing suppression unit 70, which has been moved to the advanced position P5 by the drive of the drive unit 51, to move to the X-axis direction after stopping the drive unit 51. The buffer mechanism 80 includes a first coupling portion (operation portion) 81, a rod-shaped portion (operation portion) 82, a second coupling portion 83, a first bias portion 84, and a second bias portion 85.

The first coupling portion 81 and the rod-shaped portion 82 perform a movement of an operation amount in accordance with the amount of movement of the swing suppression unit 70 to the retracted position P6 direction. Specifically, the first coupling portion 81 and the rod-shaped portion 82 move (operate) to the second coupling portion 83 side along the extending direction of the rod-shaped portion 82 in accordance with the amount of movement of the swing suppression unit 70 to the retracted position P6 direction. In more detail, the first coupling portion 81 and the rod-shaped portion 82 move farther along the extending direction of the rod-shaped portion 82 to the second coupling portion 83 side, as the amount of movement of the swing suppression unit 70 to the retracted position P6 direction increases. The first coupling portion 81 is a rod-shaped member rotatively coupled to the supporting portion 63. The rod-shaped portion 82 extends in one direction D. One end 82a of the rod-shaped portion 82 is coupled to the first coupling portion 81, and on the other end 82b of the rod-shaped portion 82, the second bias portion 85 is attached. The second coupling portion 83 includes a first body portion 83a that is coupled to the crank portion 61, a second body portion 83b on which an insertion hole 83c through which the rod-shaped portion 82 is inserted is provided and that is spaced at an interval from the first body portion 83a, and a coupling portion 83d that couples the first body portion 83a and the second body portion 83b.

The first bias portion 84 is able to come in contact with both of the first coupling portion 81 and the second body portion 83b of the second coupling portion 83. The first bias portion 84 biases the first coupling portion 81 so that the swing suppression unit 70 presses the FOUP 90. In more detail, the first bias portion biases the first coupling portion 81 so that the swing suppression unit 70 moves in the direction of pressing the FOUP 90. The first bias portion 84 is a spring.

The second bias portion 85, when the operation amount of the first coupling portion 81 and the rod-shaped portion 82 (the amount of movement of the first coupling portion 81 and the rod-shaped portion 82 to the second coupling portion 83 side in the extending direction of the rod-shaped portion 82) is greater than or equal to a predetermined amount, contacts (acts on) the rod-shaped portion 82, and biases the first coupling portion 81 and the rod-shaped portion 82 so that the swing suppression unit 70 moves in the direction of pressing the FOUP 90. In more detail, the second bias portion 85 contacts the rod-shaped portion 82 and biases the first coupling portion 81 and the rod-shaped portion 82 so that the swing suppression unit 70 presses the FOUP 90, only when the operation amount of the first coupling portion 81 and the rod-shaped portion 82 is greater than or equal to the predetermined amount. The second bias portion 85 has viscoelasticity and has an elastic modulus greater than that of the first bias portion 84. The second bias portion 85 is a rubber body made of urethane rubber, for example.

The second bias portion 85 is fixed to the other end 82b of the rod-shaped portion 82, and the second bias portion 85 moves to the first body portion 83a direction between the first body portion 83a and the second body portion 83b simultaneously with the movement of the first coupling portion 81 and the rod-shaped portion 82 to the second coupling portion 83 side. The rod-shaped portion 82 and the first body portion 83a are able to come in contact with each other via the second bias portion 85 when the operation amount of the rod-shaped portion 82 reaches the predetermined amount (see FIGS. 6B and 6C). Then, the second bias portion 85 is compressed by the rod-shaped portion 82 and the first body portion 83a, when the operation amount of the rod-shaped portion 82 is greater than the predetermined amount. That is, the second bias portion 85 acts on the rod-shaped portion 82 when the operation amount of the rod-shaped portion 82 is greater than the predetermined amount, and biases the rod-shaped portion 82 so that the swing suppression unit 70 presses the FOUP 90.

Next, an advancing-and-retracting operation in the second fall prevention portion 40 and the swing suppression unit 70 will be described. When the third gear portion 57 (see FIG. 2 and FIG. 3) rotates as the drive unit 51 (see FIG. 2 and FIG. 3) is driven, as illustrated in FIG. 4 and FIG. 5, the crank portion rotates in an arrow direction all in conjunction with this rotation. When the crank portion 61 rotates, due to the action of the connecting portion 65, the supporting portion 63 rotates in an arrow direction a12 with the rotation shaft 63a as a base point. As a result, the swing suppression unit 70 advances to the advanced position P5. When the swing suppression unit 70 is located in the advanced position P5, the rotation shaft 59, the coupling portion 65*a* between the crank portion 61 and the connecting portion 65, and the coupling portion 65*b* between the connecting portion 65 and the supporting portion 63 are located on one straight line in the one direction (an extending direction of the connecting portion 65) D (the crank portion 61 and the connecting portion 65 are located in a state of what is called a dead center). When the crank portion 61 and the connecting portion 65 are located in a state of what is called a dead center, as illustrated in FIG. 3, a rotation shaft 54*a* of the second gear portion 54, a coupling portion 55*a* that is located at a position eccentric to the rotation shaft 54*a* and is between the second gear portion 54 and the link portion 55, and a coupling portion 55*b* between the link portion 55 and the link portion 56 are located on one straight line in one direction (an extending direction of the link portion 55).

At the same time the above-described crank portion 61 rotates, the first link portion 62 rotates in an arrow direction a21 with the rotation shaft 59 as a base point. Similarly, at the same time the supporting portion 63 rotates, the second link portion 66 rotates in an arrow direction a22 with the rotation shaft 63*a* as a base point. As a result, the second fall prevention portion 40 coupled to the first link portion 62 and the second link portion 66 advances to the advanced position P3.

By the above-described series of operations, the second fall prevention portion 40 rotatively coupled to the first link portion 62 and the second link portion 66 advances from the retracted position P4 to the advanced position P3, and the swing suppression unit 70 rotatively coupled to the supporting portion 63 advances from the retracted position P6 to the advanced position P5. The movement of the second fall prevention portion 40 from the advanced position P3 to the retracted position P4 and the movement of the swing suppression unit 70 from the advanced position P5 to the retracted position P6 are performed by the operations in the reverse direction of the above-described series of operations.

Figure 6A:
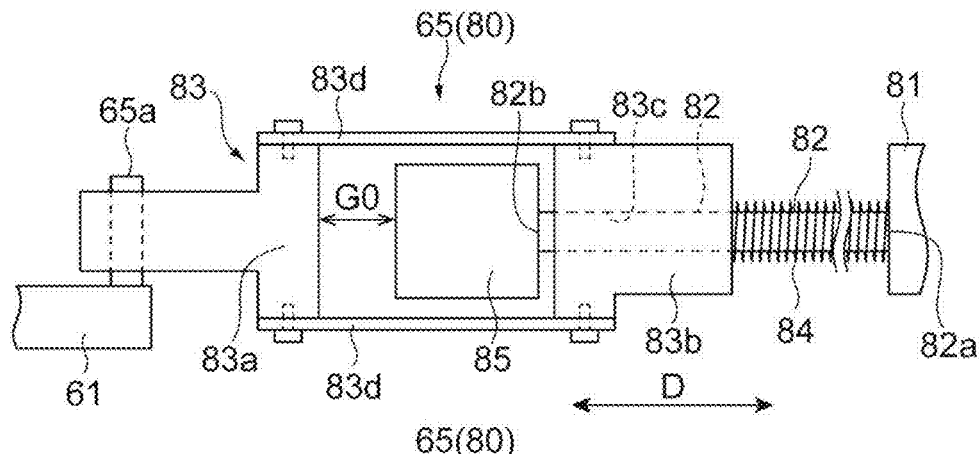
FIGS. 6A to 6D are each side views illustrating the operation transition of the buffer mechanism of FIG. 1.
Figure 6B:
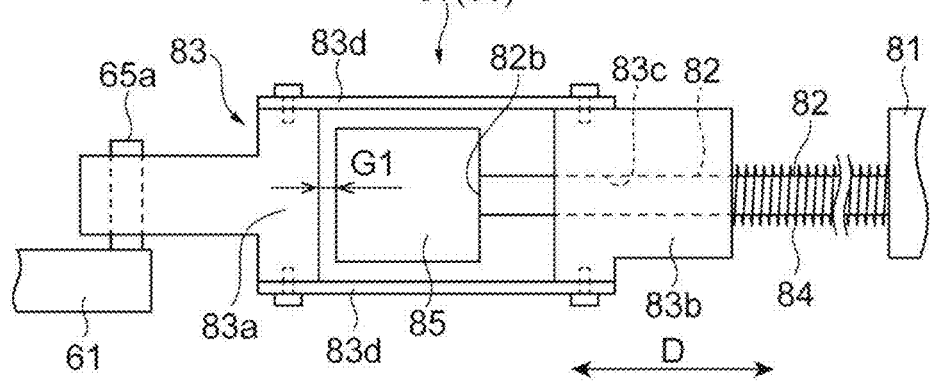
Figure 7A:
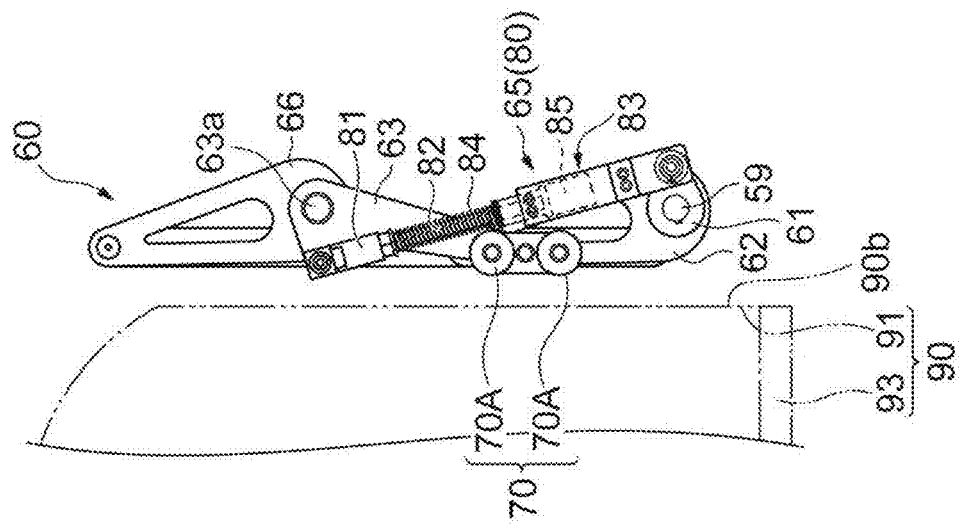
FIGS. 7A and 7B are each plan views illustrating the operation transition of the moving mechanism and the buffer mechanism of FIG. 1.
Figure 7B:
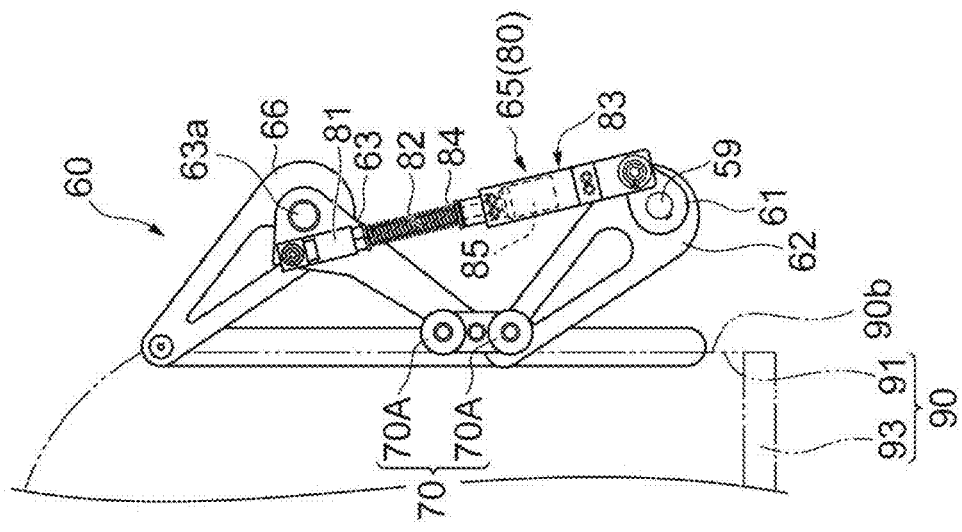

Next, an operation of the buffer mechanism 80 will be described. As illustrated in FIG. 7A, when the second fall prevention portion 40 and the swing suppression unit 70 are located in the retracted position P4 and the retracted position P6, respectively, the second bias portion 85 is, as illustrated in FIG. 6A, not in contact with the first body portion 83*a* and is spaced away by a distance G0. Then, as illustrated in FIG. 7B, from the time point when the swing suppression unit 70 comes into contact with the FOUP 90, the compression of the first bias portion 84 is started. As illustrated in FIG. 8A, when the second fall prevention portion 40 and the swing suppression unit 70 advance to the advanced position P3 and the advanced position P5, respectively, the second bias portion 85 is, as illustrated in FIG. 6B, not in contact with the first body portion 83*a* and is spaced away by a distance G1. Under this situation, the swing suppression units 70 come into contact with the side surfaces 90*b* of the FOUP 90 from front and rear in the X-axis direction and suppress the swing of the FOUP 90 to the X-axis direction. At this time, the first bias portion 84 biases the first coupling portion 81 so that the swing suppression unit 70 presses the FOUP 90 and the second bias portion 85 does not bias the rod-shaped portion 82.

Figure 6C:
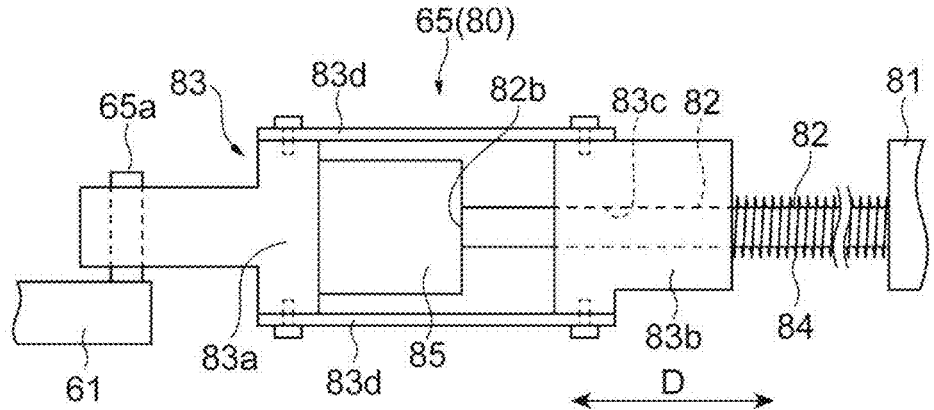
Figure 8B:
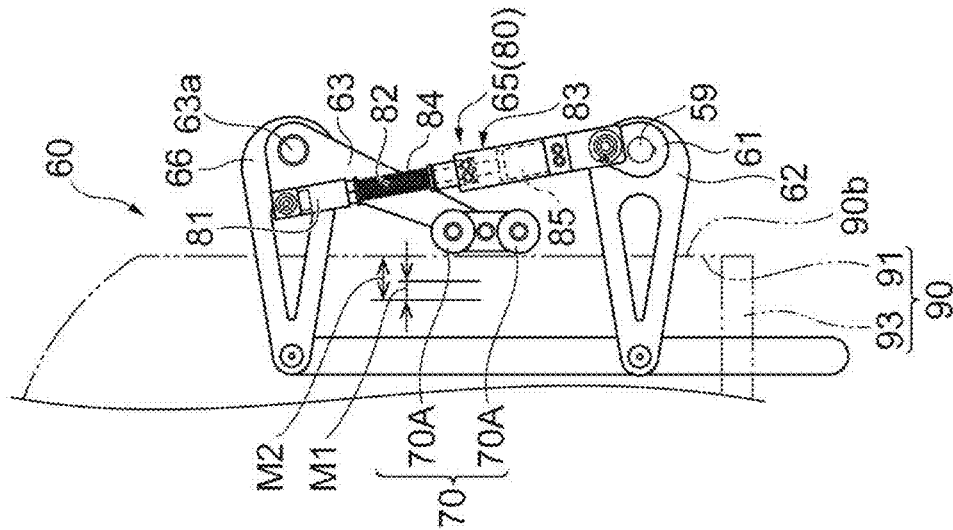
FIGS. 8A and 8B are each plan views illustrating the operation transition of the moving mechanism and the buffer mechanism of FIG. 1.
Figure 8A:
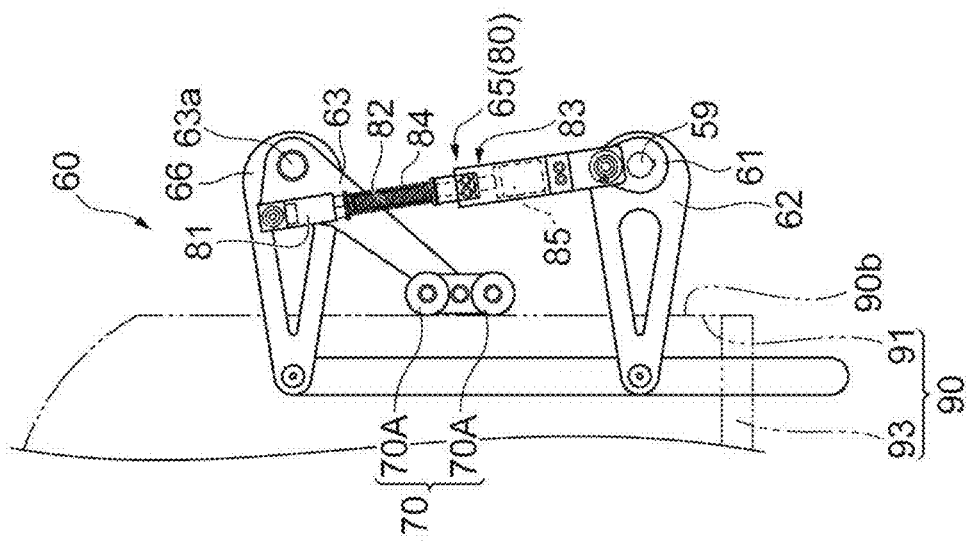

After moving to the advanced position P5 by the drive of the drive unit 51 and stopping the drive of the drive unit 51, as illustrated in FIG. 8B, when the FOUP 90 swings in the X-axis direction by the swing amount M1 due to the traveling and the like of the overhead transport vehicle 1, as illustrated in FIG. 6C, the second bias portion 85 comes into contact with the first body portion 83*a*. At this time also, similarly to the situation of FIG. 6B, the first bias portion 84 biases the first coupling portion 81 so that the swing suppression unit 70 presses the FOUP 90 and the second bias portion 85 does not bias the rod-shaped portion 82.

Figure 6D:
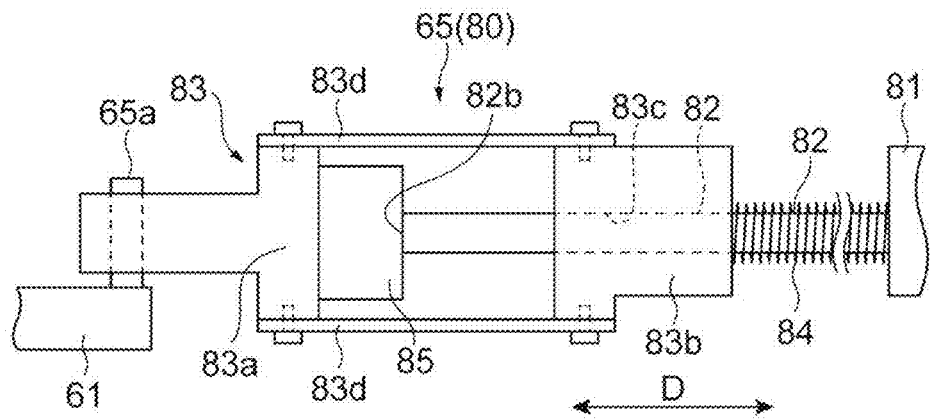

Furthermore, when the FOUP 90 swings in the X-axis direction by the swing amount M2 (M2>M1), as illustrated in FIG. 6D, the second bias portion 85 is compressed by the rod-shaped portion 82 and the first body portion 83*a*. This causes the second bias portion 85 to act on the rod-shaped portion 82 and to bias the rod-shaped portion 82 so that the swing suppression unit 70 presses the FOUP 90. At this time also, the first bias portion 84 biases the first coupling portion 81 so that the swing suppression unit 70 presses the FOUP 90. That is, in the buffer mechanism 80 of the above-described preferred embodiment, when a swing greater than the predetermined swing amount M1 occurs on the FOUP 90 and the swing suppression unit 70 is pushed down from the advanced position P5 to the retracted position P6 direction, the rod-shaped portion 82 is pushed down to the first body portion 83*a* side in the one direction D in accordance with the pushed-down amount. Then, the second bias portion 85 compressed by the rod-shaped portion 82 and the first body portion 83*a* acts on the rod-shaped portion 82, and biases the rod-shaped portion 82 so that the swing suppression unit 70 presses the FOUP 90. In other words, the second bias portion 85 has an elastic force that resists the force of the rod-shaped portion 82 trying to move to the first body portion 83*a*.

Figure 9:
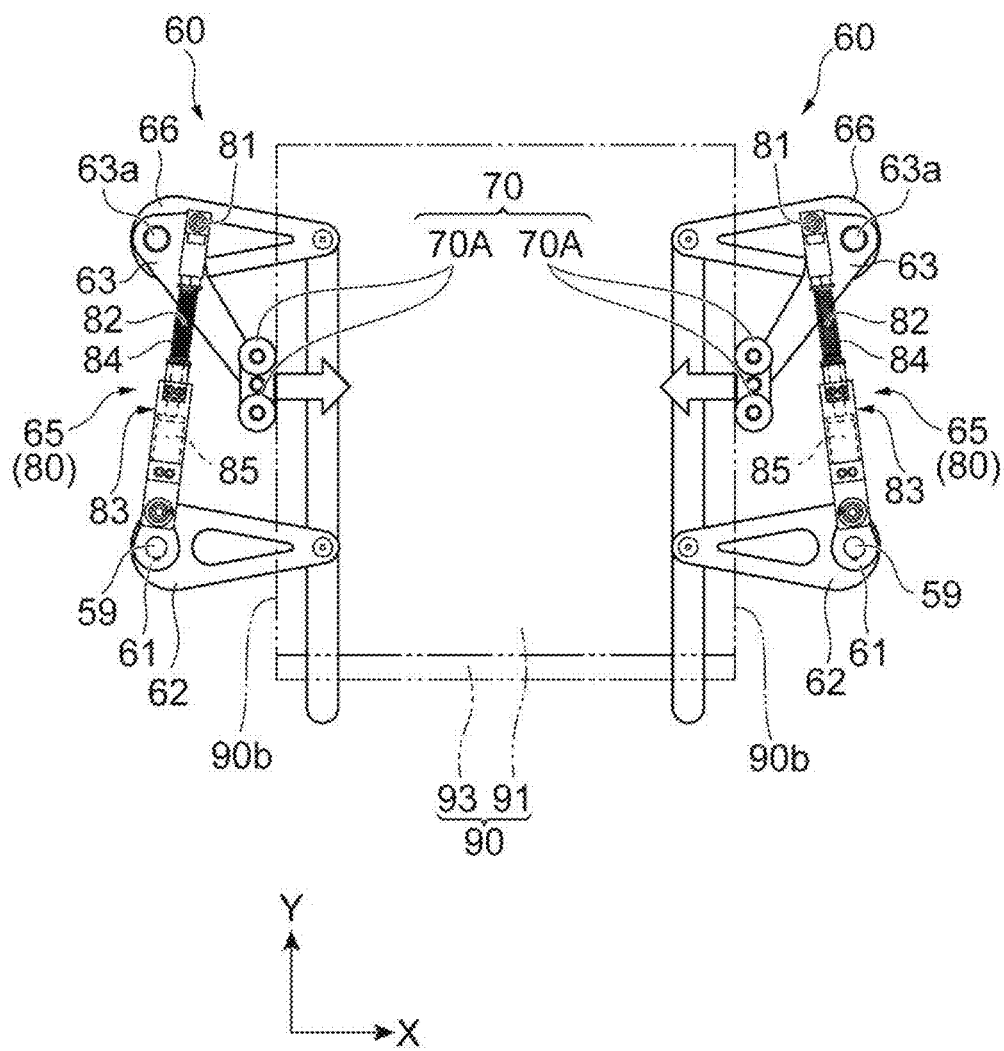
FIG. 9 is a diagram illustrating a state of the moving mechanism and the buffer mechanism in a steady state and (b) is a diagram illustrating a state of the moving mechanism and the buffer mechanism at the time of occurrence of a swing.
Figure 10:
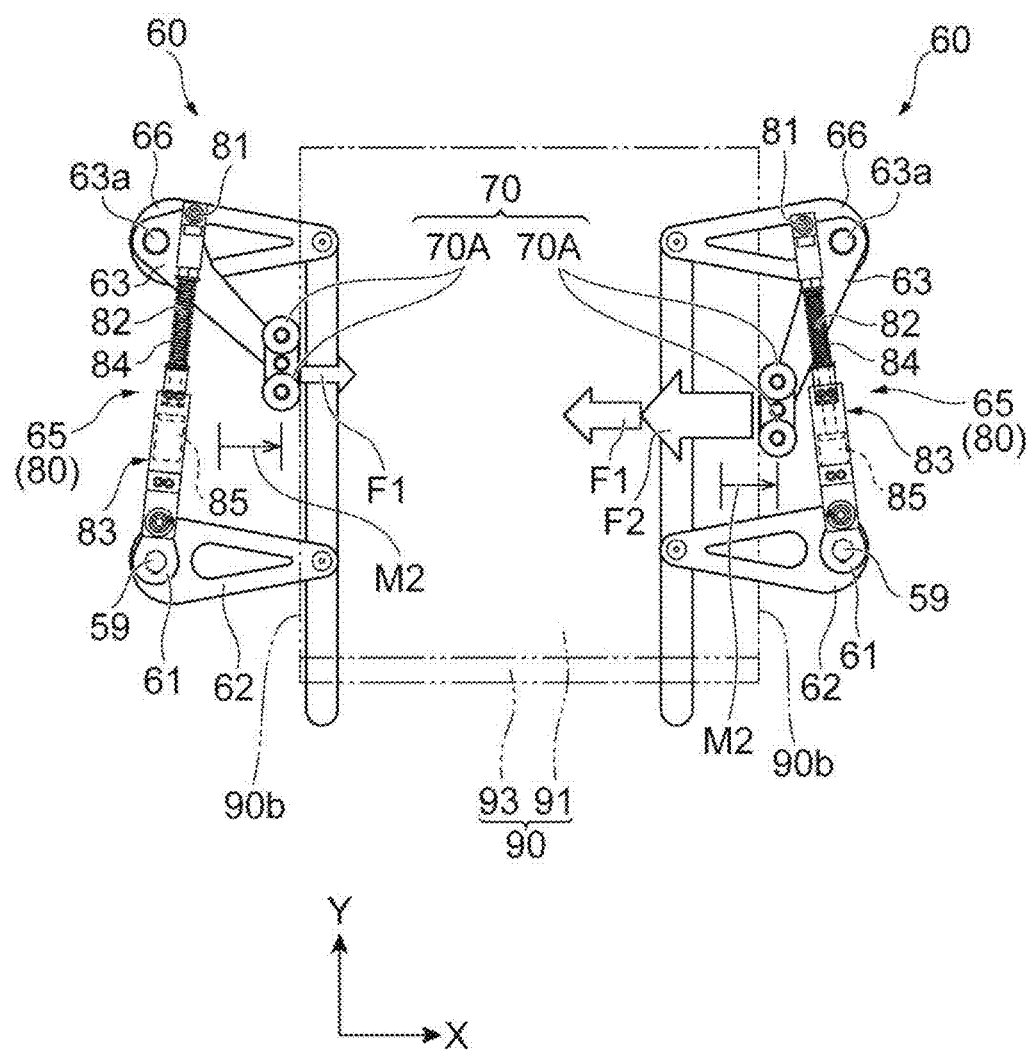
FIG. 10 is a diagram illustrating a state of the moving mechanism and the buffer mechanism at the time of occurrence of a swing.

In the overhead transport vehicle 1 of the above-described preferred embodiment, as illustrated in FIG. 9, after stopping the drive unit 51, when a swing occurs on the FOUP 90 and the swing suppression unit 70 moves in the X-axis direction, if the swing amount of the FOUP 90 is within the predetermined range (swing amount M1), only the first bias portion 84 biases the swing suppression unit 70 at the force F1 via the first coupling portion 81 so as to press the FOUP 90. Meanwhile, as illustrated in FIG. 10, if the swing of the FOUP 90 exceeds the predetermined range (swing amount M1), the second bias portion 85 is compressed and acts on the rod-shaped portion 82, and biases the swing suppression unit 70 with the combined force of the force F1 and the force F2 via the rod-shaped portion 82 so as to press the FOUP 90. As a result, as soon as the swing of the FOUP 90 exceeds the predetermined range, the biasing force acting on the FOUP 90 is instantaneously switched from the force F1 to the combined force of the force F1 and the force F2. When the swing amount exceeds the predetermined range, one swing suppression unit 70 that is pushed out by the FOUP 90 is biased with relatively large biasing force, and the other swing suppression unit 70 is biased with relatively small biasing force. As a result, a situation in which the swing of the FOUP 90 continues due to both swing suppression units 70 and 70 pushing each other with the same biasing force is able to be suppressed. That is, as compared with the case of being supported with the same magnitude of biasing force from front and rear in the X-axis direction, the swing of the FOUP 90 in the X-axis direction is able to be effectively suppressed.

Furthermore, in the present preferred embodiment, when suppressing the FOUP 90 from front and rear in the X-axis direction by the swing suppression units, as compared with the case of simply increasing the biasing force (elastic force), there are following advantages. That is, when the biasing force is increased, because the force at the time of contact with the FOUP 90 increases and also the force received from the swinging FOUP 90 increases, there is a need to increase the capacity of the drive unit so as to resist the force thereof. When the capacity of the drive unit increases, the weight of the overhead transport vehicle 1 increases, and also the size increases. In the overhead transport vehicle 1 of the present preferred embodiment, because the force at the time of contact with the FOUP 90 is relatively small and also the force received from the FOUP 90 is small when the swing amount is within the range of M1, an increase in weight of the overhead transport vehicle 1 and an increase in size is able to be reduced or prevented.

As illustrated in FIG. 4 and FIG. 5, in the overhead transport vehicle 1 of the above-described preferred embodiment, because the buffer mechanism 80 is provided in the connecting portion 65, the buffer mechanism 80 can be compactly mounted. Moreover, as illustrated in FIG. 5, in the overhead transport vehicle 1 of the above-described preferred embodiment, when the swing suppression unit 70 is located in the advanced position P5, the crank portion 61 and the connecting portion 65 are located in what is called a dead center (the rotation shaft 59, the coupling portion 65a between the crank portion 61 and the connecting portion 65, and the coupling portion 65b between the connecting portion 65 and the supporting portion 63 are located on one straight line in the one direction (the extending direction of the connecting portion 65) D), and an external force exerted on the swing suppression unit 70 after stopping the drive unit 51 is difficult to be transmitted to the drive unit 51. As a result, without using the drive unit 51 with large output, it is possible to resist the force transmitted to the swing suppression unit 70.

In the overhead transport vehicle 1 of the above-described preferred embodiment, because the second fall prevention portion 40 that prevents the fall of the FOUP 90 can be driven by utilizing the power of the drive unit 51 that is a drive source of the swing suppression unit 70, as compared with providing a drive unit for each drive mechanism, an overall size of the device is able to be made compact.

In the overhead transport vehicle 1 of the above-described preferred embodiment, because the elastic modulus of the second bias portion 85 is greater than the elastic modulus of the first bias portion 84, the swing of the FOUP 90 in the X-axis direction is able to be effectively eliminated. Moreover, in the overhead transport vehicle 1 of the above-described preferred embodiment, because the second bias portion 85 is made of a rubber material having viscoelasticity, the swing of the FOUP 90 can be attenuated and the swing of the FOUP 90 in the X-axis direction can be eliminated more effectively.

Preferred embodiments of the present invention have been described above. However, the present invention is not limited to the above-described preferred embodiments, and various modifications are possible within a scope not departing from the spirit of the present invention.

In the above-described preferred embodiments, an example in which the first fall prevention portion 20, the second fall prevention portion 40, and the swing suppression unit 70 interlock with one another has been described, but each may operate individually, or any two elements may interlock.

Figure 11:
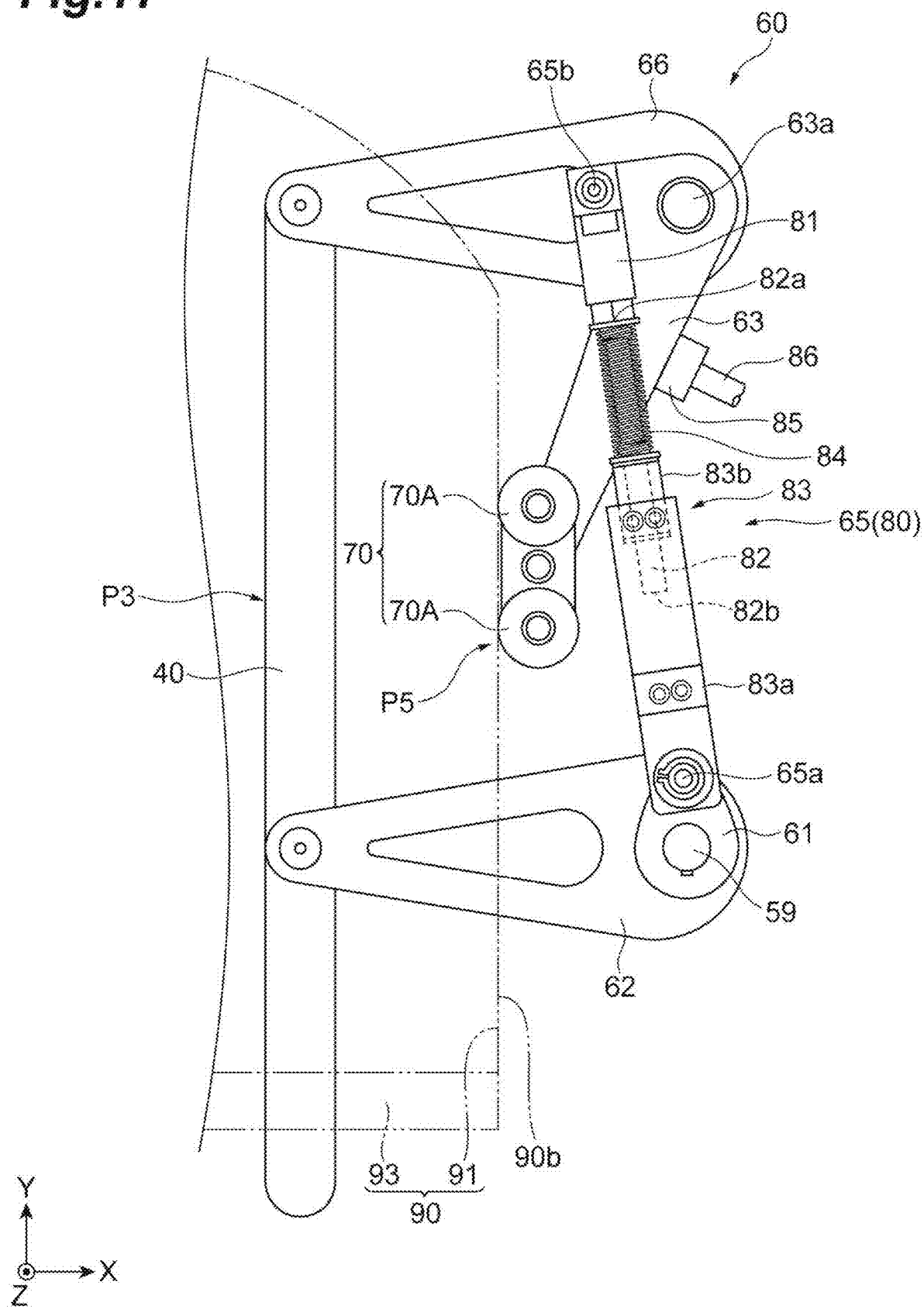
FIG. 11 is a perspective view illustrating a state of the moving mechanism and the buffer mechanism when a swing suppression unit according to a modification is located in the advanced position.

In the above-described preferred embodiments and modifications, an example in which the second bias portion 85 is provided in the connecting portion 65 has been described, but the preferred embodiments are not limited thereto. As illustrated in FIG. 11, the second bias portion 85 may contact a portion of the supporting portion 63 when, for example, a swing greater than the predetermined swing amount M1 occurs on the FOUP 90 and when the swing suppression unit 70 is pushed down from the advanced position P5 to the retracted position P6 direction. In this case, the second bias portion 85 can be provided in a movable biasing-portion supporting member 86 and may be advanced to the position capable of contacting a portion of the supporting portion 63 after moving the swing suppression unit 70 to the advanced position P5 by the drive of the drive unit 51. According to this configuration, the second bias portion 85 can be arranged, even on a moving path of the swing suppression unit 70 from the retracted position P6 to the advanced position P5.

In the above-described preferred embodiment and modification, an example in which the second bias portion 85 is, as illustrated in FIG. 6B, not in contact with the first body portion 83a and is spaced away by the distance G1 when, as illustrated in FIG. 8A, the second fall prevention portion 40 and the swing suppression unit 70 advance to the advanced position P3 and the advanced position P5, respectively, has been described, but the preferred embodiments are not limited thereto. For example, in a situation of the second fall prevention portion 40 and the swing suppression unit 70 illustrated in FIG. 8A, the second bias portion 85 may be in contact with the first body portion 83a as illustrated in FIG. 6C, the second bias portion 85 may be in a state of being compressed already as illustrated in FIG. 6D, or the second bias portion 85 and the first body portion 83a may be away from each other so that the distance therebetween is longer than the distance G1 illustrated in FIG. 7B.

By separating by the distance G1 as in the above-described preferred embodiment, the vibration that occurs on the overhead transport vehicle 1 is able to be prevented from being transmitted to the FOUP 90 and, as in the above-described modification, the influence of the above-described vibration can be further reduced if the distance is made longer. Furthermore, in a state of the swing suppression unit 70 illustrated in FIG. 8A, if the second bias portion 85 is configured to be in a state of being compressed already, the FOUP 90 is able to be suppressed with a stronger force.

In the above-described preferred embodiments and modifications, an example in which the first bias portion 84 is a spring and in which the second bias portion 85 is a rubber body has been described. However, the rubber body and the spring may be selected from a gel elastic body and the like made of, for example, a silicone resin or the like as appropriate. Furthermore, as for the elastic moduli of the first bias portion 84 and the second bias portion 85, both may be the same, or the first bias portion 84 may have a greater elastic modulus than the second bias portion 85.

In the above-described preferred embodiments and modifications, as an example of a transported object that is transported by the overhead transport vehicle 1, the FOUP has been described, but it may be a cassette, a magazine, a tray, a container, or the like.

In the above-described preferred embodiments and modifications, an example in which the swing suppression unit 70 includes the two rollers 70A and 70A has been described, but it may include a block-shaped member made of resin material, for example.

In the above-described preferred embodiments and modifications, an example in which the transported object is transported in a suspended state has been described, but it may be of a configuration in which the transported object placed on a placement portion is supported from front and rear in the X-axis direction.

In the above-described preferred embodiments and modifications, an example in which one aspect of a preferred embodiment of the present invention is applied to the overhead transport vehicle 1 that travels on the traveling rail 2 laid on the ceiling has been described, but it may be applied to a transport vehicle that travels on a rail installed on the floor or may be applied to a trackless transport vehicle. Furthermore, it can also be applied to a stacker crane capable of moving a transfer unit in the horizontal direction along the rail on the floor surface and capable of moving the transfer unit in the vertical direction (raising and lowering) along a mast, a transport device capable of moving in only one of the horizontal direction or the vertical direction, or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport vehicle comprising:
 a pair of swing suppression units configured to contact a transported object from front and rear in a traveling direction;
 a moving mechanism configured to move at least one of the swing suppression units in the traveling direction between a first position contacting the transported object and a second position spaced away from the transported object by a drive of a drive unit; and
 a buffer mechanism configured to allow the swing suppression unit that has been moved to the first position by the drive of the drive unit to move to the traveling direction after stopping the drive of the drive unit; wherein
 the buffer mechanism includes:
  an operation portion coupled to the swing suppression unit and configured to perform a movement of an operation amount in accordance with an amount of movement of the swing suppression unit in a direction toward the second position;
  a first bias portion configured to bias the operation portion so that the swing suppression unit presses the transported object; and
  a second bias portion configured to act on the operation portion when the operation amount of the operation portion is greater than a predetermined amount and to bias the operation portion so that the swing suppression unit presses the transported object; and
 the moving mechanism includes:
  a supporting portion rotatable bidirectionally around a rotation shaft and configured to support the swing suppression unit;
  a drive shaft configured to rotate by a drive of the drive unit;
  a crank portion configured to rotate bidirectionally by rotation of the drive shaft; and
  a connecting portion coupled at one end to a position that is eccentric to the drive shaft of the crank portion so as to be rotatable bidirectionally and coupled at the other end to a position that is eccentric to the rotation shaft of the supporting portion so as to be rotatable bidirectionally.

2. The transport vehicle according to claim 1, wherein the drive shaft, a coupling position between the crank portion and the connecting portion, and a coupling portion between the connecting portion and the supporting portion are located on one straight line in an extending direction of the connecting portion when the swing suppression unit is located at the first position.

3. The transport vehicle according to claim 2, wherein
the buffer mechanism is provided in the connecting portion;
the operation portion includes a first coupling portion coupled to the supporting portion and a rod-shaped portion coupled at a first end to the first coupling portion;
the buffer mechanism further includes a second coupling portion including a first body portion coupled to the crank portion and a second body portion that has an insertion hole through which the rod-shaped portion is inserted, and that is spaced at an interval from the first body portion;
the first bias portion is arranged so as to contact the first coupling portion and the second body portion;
the second bias portion is arranged in the first body portion or fixed to a second end of the rod-shaped portion, and
the rod-shaped portion and the first body portion come into contact with each other via the second bias portion when an operation amount of the operation portion exceeds a predetermined amount.

4. The transport vehicle according to claim 3, wherein
the moving mechanism includes a first link portion fixed to the drive shaft, a second link portion rotatable bidirectionally around the rotation shaft, and a third link portion coupled to both of the first link portion and the second link portion so as to be rotatable bidirectionally;
the third link portion is movable between an advanced position arranged below the transported object and a retracted position arranged at a position retracted from below the transported object;
movement of the third link portion to the advanced position interlocks with movement of the swing suppression unit to the first position; and
movement of the third link portion to the retracted position interlocks with movement of the swing suppression unit to the second position.

5. The transport vehicle according to claim 2, wherein
the moving mechanism includes a first link portion fixed to the drive shaft, a second link portion rotatable bidirectionally around the rotation shaft, and a third link portion coupled to both of the first link portion and the second link portion so as to be rotatable bidirectionally;
the third link portion is movable between an advanced position below the transported object and a retracted position arranged at a position retracted from below the transported object;
movement of the third link portion to the advanced position interlocks with movement of the swing suppression unit to the first position; and
movement of the third link portion to the retracted position interlocks with movement of the swing suppression unit to the second position.

6. The transport vehicle according to claim 1, wherein
the buffer mechanism is provided in the connecting portion;
the operation portion includes a first coupling portion coupled to the supporting portion and a rod-shaped portion coupled at a first end to the first coupling portion;
the buffer mechanism further includes a second coupling portion including a first body portion coupled to the crank portion and a second body portion that has an insertion hole through which the rod-shaped portion is inserted, and that is spaced at an interval from the first body portion;

the first bias portion is arranged so as to contact the first coupling portion and the second body portion;

the second bias portion is arranged in the first body portion or fixed to a second end of the rod-shaped portion, and the rod-shaped portion and the first body portion come into contact with each other via the second bias portion when an operation amount of the operation portion exceeds a predetermined amount.

7. The transport vehicle according to claim 6, wherein the moving mechanism includes a first link portion fixed to the drive shaft, a second link portion rotatable bidirectionally around the rotation shaft, and a third link portion coupled to both of the first link portion and the second link portion so as to be rotatable bidirectionally;

the third link portion is movable between an advanced position below the transported object and a retracted position arranged at a position retracted from below the transported object;

movement of the third link portion to the advanced position interlocks with movement of the swing suppression unit to the first position; and movement of the third link portion to the retracted position interlocks with movement of the swing suppression unit to the second position.

8. The transport vehicle according to claim 1, wherein the moving mechanism includes a first link portion fixed to the drive shaft, a second link portion rotatable bidirectionally around the rotation shaft, and a third link portion coupled to both of the first link portion and the second link portion so as to be rotatable bidirectionally;

the third link portion is movable between an advanced position below the transported object and a retracted position arranged at a position retracted from below the transported object;

movement of the third link portion to the advanced position interlocks with movement of the swing suppression unit to the first position; and movement of the third link portion to the retracted position interlocks with movement of the swing suppression unit to the second position.

9. The transport vehicle according to claim 1, wherein, an elastic modulus of the second bias portion is greater than an elastic modulus of the first bias portion.

10. The transport vehicle according to claim 1, wherein, the second bias portion has viscoelasticity.

11. The transport vehicle according to claim 1, wherein, the first bias portion is a spring and the second bias portion is a rubber body.

* * * * *